United States Patent
Lee et al.

(10) Patent No.: US 6,912,770 B2
(45) Date of Patent: Jul. 5, 2005

(54) METHOD FOR FABRICATING MAGNETIC FIELD SENSOR

(75) Inventors: Dok Won Lee, Chungcheongbuk-do (KR); Dong Joon Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 83 days.

(21) Appl. No.: 10/316,783

(22) Filed: Dec. 11, 2002

(65) Prior Publication Data

US 2003/0112007 A1 Jun. 19, 2003

(30) Foreign Application Priority Data

Dec. 18, 2001 (KR) .................................. 10-2001-0080441

(51) Int. Cl.$^7$ ........................ G11B 5/127; H04R 31/00
(52) U.S. Cl. ................. 29/603.14; 29/603.09; 29/603.15; 29/603.25; 29/593; 360/123; 324/210
(58) Field of Search .................... 257/751, 740, 257/757, 762; 438/595, 627, 643, 653, 682; 29/593, 603.08, 603.09, 603.12, 603.15, 603.16; 360/324.11, 317, 113; 324/252; 428/692

(56) References Cited

U.S. PATENT DOCUMENTS

| | | | | |
|---|---|---|---|---|
| 5,695,810 A | * | 12/1997 | Dubin et al. | 438/643 |
| 5,818,323 A | * | 10/1998 | Maeda et al. | 338/32 R |
| 5,998,040 A | * | 12/1999 | Nakatani et al. | 428/611 |
| 6,093,966 A | * | 7/2000 | Venkatraman et al. | 257/751 |
| 6,303,462 B1 | * | 10/2001 | Gidon | 438/406 |
| 6,342,448 B1 | * | 1/2002 | Lin et al. | 438/687 |
| 6,716,644 B2 | * | 4/2004 | Nejad et al. | 438/3 |
| 6,718,621 B1 | * | 4/2004 | Hayashi et al. | 29/603.08 |
| 2003/0112007 A1 | * | 6/2003 | Lee et al. | 324/252 |

* cited by examiner

Primary Examiner—Minh Trinh
(74) Attorney, Agent, or Firm—Ladas & Parry LLP

(57) ABSTRACT

To fabricate a magnetic field sensor, a copper barrier film is formed. A magnetic metal film is formed on the barrier film. A plurality of trenches is formed with a desired thickness in the magnetic metal film. A copper film is formed in the plurality of trenches, so that multiple layers of magnetic metal film and copper film are formed. The RF semiconductor device equipped with the magnetic field sensor includes a magnetic field sensor made by the above method. The magnetic field sensor is attached on a semiconductor substrate. Metal wirings are formed at near the both sides of the magnetic field sensor. An insulating film is formed on top. An inductor is formed on the insulating film at predetermined locations.

12 Claims, 3 Drawing Sheets

METHOD FOR FABRICATING MAGNETIC FIELD SENSOR

BACKGROUND OF THE INVENTION

1. Field of the Invention

The present invention relates to a method for fabricating a semiconductor device, more particularly to a method for fabricating a magnetic field sensor having a multi-layer structure composed of cobalt (Co)/copper (Cu) by using a copper electroplating deposition method, and an RF semiconductor device equipped with such a magnetic field sensor.

2. Description of the Prior Art

As generally known in the art, an inductor is indispensable for the driving of an RF semiconductor device. However, a magnetic field generated from the inductor produces an eddy current to a surrounding conductor by means of latitudinal electromotive force.

The eddy current thus generated produces an undesired signal or acts as noise, thereby producing problems at the time of driving a semiconductor device.

Furthermore, in the case of there being a neighboring transistor, a driving fault of the semiconductor device may be produced due to a signal misinterpretation caused by the eddy current.

Accordingly, necessities have increased for a sensor capable of controlling a magnetic field by perceiving a magnetic field, and measuring the strength of the magnetic field.

SUMMARY OF THE INVENTION

Accordingly, the present invention has been made to solve the above-mentioned problems occurring in the prior art, and an object of the present invention is to provide a method for fabricating a magnetic field sensor having a multi-layer structure and an RF semiconductor device equipped with the magnetic field sensor, which is capable of improving sensitivity of the magnetic field sensor by increasing the number of layers in the multi-layer structure, which is achieved by employing the electroplating deposition method, which has good filling capability.

In order to accomplish this object, there is provided a method for fabricating a magnetic field sensor having a multi-layer structure, the method comprises: forming a barrier film on a lower layer, forming a magnetic metal film on the barrier film, forming a plurality of trenches with desired intervals in the magnetic metal film, forming copper films in the plurality of trenches, so that multiple layers of the magnetic metal films and copper films be formed repeatedly.

Also, according to another aspect of the present invention, there is provided an RF semiconductor device equipped with a magnetic field sensor, the RF semiconductor device comprises: a magnetic field sensor made by forming a plurality of layers of magnetic metal film and copper film, the magnetic field sensor being loaded on a semiconductor substrate, metal wirings formed on the semiconductor substrate at both sides of the magnetic field sensor, an insulating film formed on an entire structure of the semiconductor substrate, inclusive of the metal wirings, an inductor formed on the insulating film corresponding to the magnetic field sensor with the exception of a central portion thereof.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

According to a method for fabricating a magnetic field sensor having a multi-layer structure in accordance with the present invention, at first, a layer which requires a magnetic field sensor should be determined.

For example, in the case of a semiconductor device employing a cobalt silicide process, attachment of the magnetic field sensor can be performed at the deposition step of a cobalt (Co) thin film so as to simplify the process in the fabrication of the semiconductor device.

Figure 1:
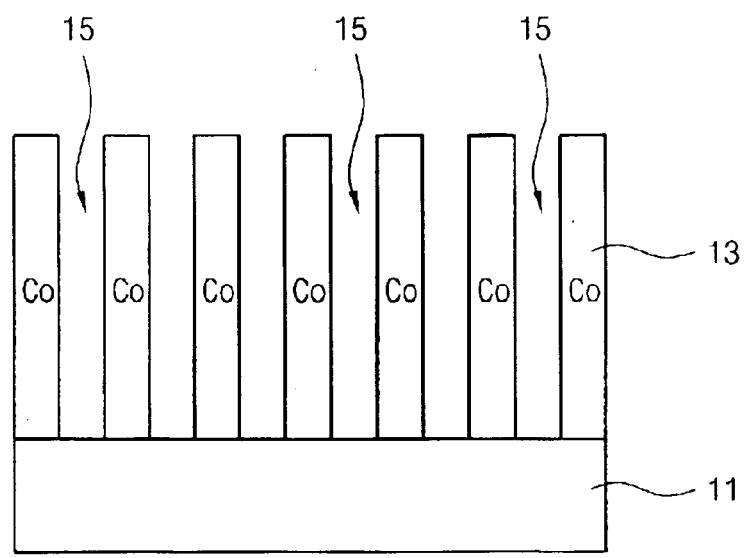
FIG. 1 to FIG. 3 are sectional views illustrating each steps of the method for fabricating a magnetic field sensor having a multi-layer structure in accordance with the present invention.

Referring to FIG. 1, in accordance with a method for fabricating a magnetic field sensor having a multi-layer structure of the present invention, a copper (Cu) barrier film 11 is first deposited on a lower layer (not shown) firstly. In this instance, Ta, TaN, TiN, WN, etc., can be used as the barrier film 11, and a sputtering method, a CVD method, etc., can be employed as the deposition method. Also, the barrier film is deposited to a thickness of 100 to 1000 Å.

Then, a cobalt (Co) film 13 is deposited on the Cu barrier film 11 to a thickness of about 100 to 10000 Å by using a sputtering method.

Subsequently, although not shown in the drawings, photo-sensitive materials are distributed on the cobalt film 13, and a photo-sensitive film (not shown) is formed through carrying out an exposure process, a developing process, and a selective removing of the photo-sensitive materials.

Next, trenches 15 are formed by selective removing of the cobalt film 13 by using the photo-sensitive pattern (not shown) as a mask. In this instance, the trenches 15 are controlled to be 1 to 1000 $\mu$m in length, 0.05 to 1 $\mu$m in width, 0.05 to 1 μm in thickness, and the number of repetitions (N) for the copper layer and the cobalt layer formed in the following process is to be 2 to 100.

In this instance, the thickness of the copper film is determined so that the cobalt films positioned on both sides of the copper film do not concord as regards the directions of magnetization. Otherwise, the directions of magnetization of the two neighboring magnetic films are different when a magnetic field is not applied, however, the directions of magnetization of the two are aligned when a magnetic field is applied. That is, a GMR (Giant Magnetoresistance) phenomena can be produced.

Figure 5:
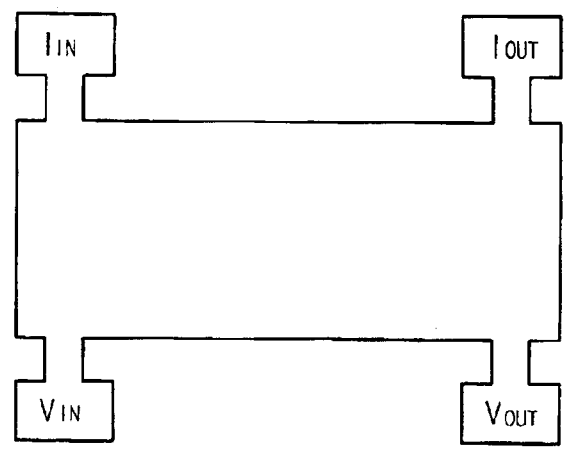
FIG. 5 is a view showing a direction of magnetization according to a magnetic field in the method for fabricating a magnetic field sensor having a multi-layer structure in accordance with the present invention.

As shown in FIG. 5, it is important to select the thickness of the copper film so that directions of magnetization are different. The interactions between magnetizations of the cobalt films positioned on both sides of the copper film vary along with the change of the thickness of the copper film, the thickness of the copper film can be determined based on the above explained property.

Continuing, although not shown in the drawings, a copper seed film (not shown) is deposited. In this instance, a sputtering method and a CVD method can be employed as a deposition method, and it is deposited to a thickness of 100 to 2000 Å.

Figure 2:
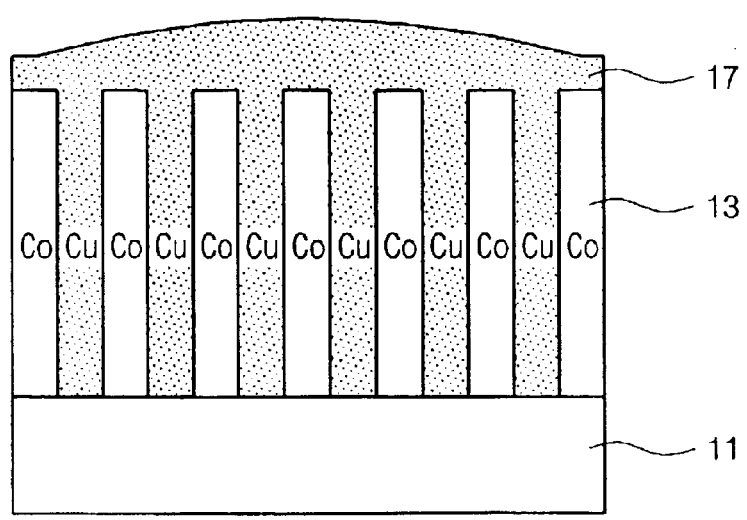

Referring to FIG. 2, the trenches 15 are filled up by depositing a copper film 17 using an electroplating deposition method. In this instance, trenches with a high aspect ratio can be filled up using the good filling capabilities of the electroplating deposition method.

Figure 3:
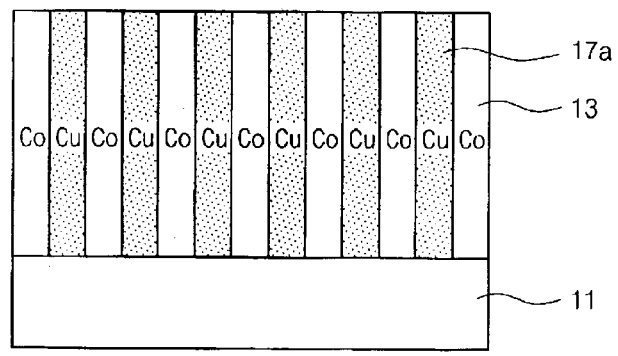

Referring now to FIG. 3, a copper film pattern 17a is formed in the trenches 15 by planarization of the copper film 17 using CMP (Chemical-Mechanical Polishing) process.

Figure 4:
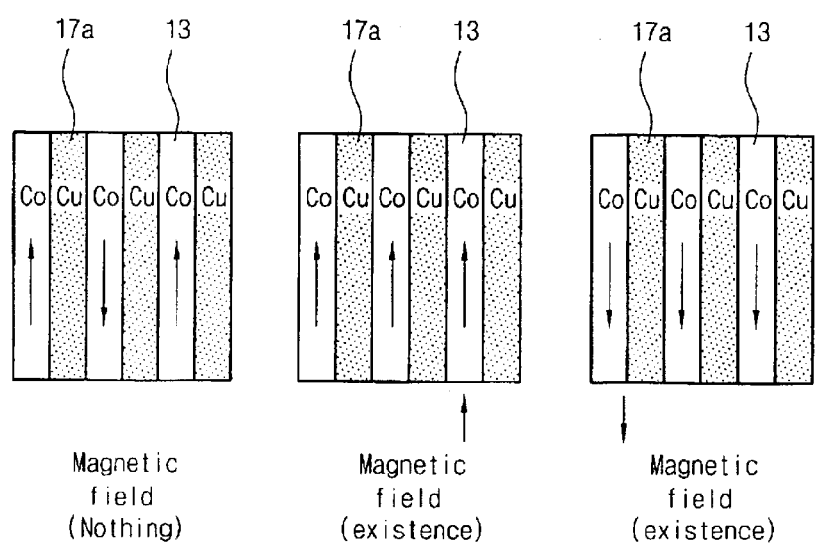
FIG. 4 is a schematic view showing a 4-point probe made by the method for fabricating a magnetic field sensor having a multi-layer structure in accordance with the present invention.

Then, as shown in FIG. 4, a 4-point probe pattern is formed by carrying out a patterning process composed of a photo process and an etching process.

Figure 6:
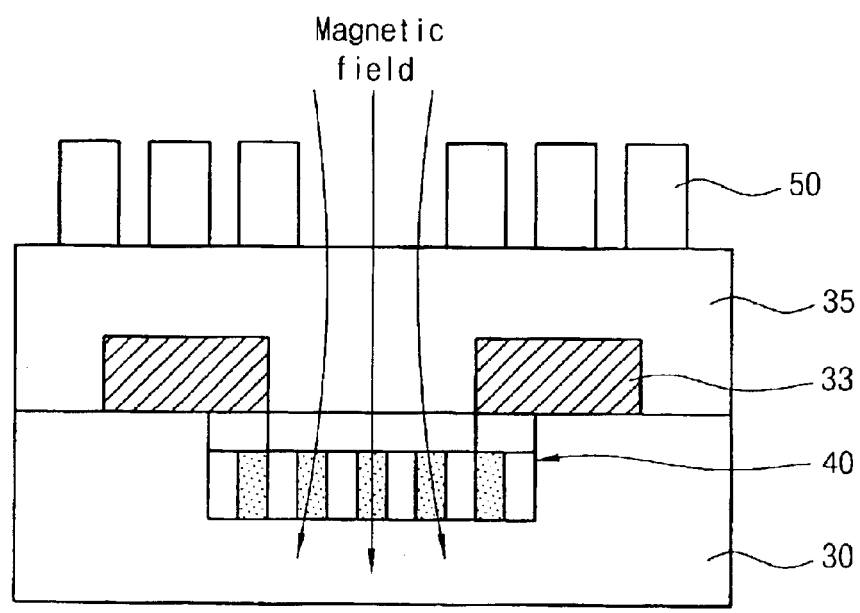
FIG. 6 is a sectional view showing an RF semiconductor device equipped with an inductor and a magnetic field sensor having a multi-layer structure in accordance with the present invention.

Subsequently, as shown in FIG. 6, a semiconductor device equipped with a magnetic field sensor and an inductor is fabricated by carrying out successive processes for fabricating a semiconductor device.

Now, a method for fabricating a semiconductor device equipped with a magnetic field sensor and an inductor of the present invention is explained below.

At first, a magnetic field sensor 40 made through the above process is attached on a desired region in a semiconductor substrate 30.

Then, an insulating film 35 is deposited on the entire surface of the whole structure after metallic wirings 33 are formed at peripheries in both sides of an upper surface of the semiconductor substrate 30, which correspond to edge portions of the magnetic field sensor.

Subsequently, a plurality of inductors 50 are formed with a desired interval on the insulating film 35, with the exception of a central portion of the magnetic field sensor 40, thereby resulting in accomplishing of an RF semiconductor device.

When a magnetic field sensor having Co/Cu multi-layer structure is loaded on the RF semiconductor device as explained above, a magnetic field in the semiconductor device can be perceived by measuring an electrical resistance.

In accordance with the method for fabricating a magnetic field sensor having a multi-layer structure and an RF semiconductor device equipped with the magnetic field sensor of the present invention, as explained above, following advantages are achieved.

According to the present invention, a magnetic field in the semiconductor device can be perceived and the strength of the magnetic field can be measured by using the GMR (Giant Magnetoresistance) phenomena, which is observed in a multi-layer structure made of Cu/Co×N (N≧2) layers composed of non-magnetic copper and magnetic cobalt. According to the present invention, the resistance measured when the magnetic field is applied can be reduced by more than 50 percent, comparing with the resistance measured when the magnetic field is not applied.

Furthermore, the strength of the magnetic field can be measured by utilizing a change in the degree of resistance, because the strength of resistance changes according to the strength of the magnetic field.

Also, according to the present invention, it is easy to employ a magnetic field sensor having a cobalt/copper multi-layer structure, as copper and cobalt are materials already in use in the semiconductor fabrication process. However, a similar sensing of magnetic fields can be achieved by using a multi-layer structure composed of Ni/Cu, NiCo/Cu, Fe/Cu, etc.

Meanwhile, how the strength of a magnetic field affects the characteristics of a transistor can be observed by perceiving the magnetic field in a semiconductor device and measuring the strength of the magnetic field in it.

Also, the strength of the magnetic field can be controlled by feedback to an inductor, which is employed in an RF semiconductor device, after measuring the strength of the magnetic field produced in the inductor.

As GMR effects can be observed in all directions of the magnetic field, it is possible to perceive the magnetic field regardless of the position and structure of the inductor.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a magnetic field sensor having a multi-layer structure, the method comprising the steps of:
    forming a copper barrier film an a lower layer;
    forming a magnetic metal film on the copper barrier film;
    forming a plurality of trenches with a desired thickness in the magnetic metal film formed on the copper barrier film; and
    filling the trenches with copper to form a plurality of alternating copper and magnetic metal film layers.

2. The method according to claim 1, wherein the copper barrier film 19 made of any one selected from Ta, TaN, TiN, WN.

3. The method according to claim 1, wherein the copper barrier film is deposited by a sputtering method or a CVD method.

4. The method according to claim 1, wherein the copper barrier film is deposited to a thickness of 100 to 1000 Å.

5. The method according to claim 1, wherein the magnetic metal film is deposited to a thickness of 100 to 10000 Å.

6. The method according to claim 1, wherein the magnetic metal film includes a cobalt film.

7. The method according to claim 1, wherein the magnetic metal film includes Ni, NiCo, and Fe.

8. The method according to claim 6, wherein the cobalt film is deposited by employing a sputtering method.

9. The method according to claim 1, wherein the number of the magnetic metal film and the copper layers is 2 to 100.

10. The method according to claim 1, wherein the trenches are 1 to 1000 µm in length, 0.05 to 1 µm in width, and 0.05 to 1 µm in thickness.

11. The method according to claim 1, wherein the step of filling the trenches with copper includes:

forming a copper seed film on the barrier film, inclusive of the trenches;

depositing a layer of copper film on the barrier film, inclusive of the trenches; and removing the excess copper outside the trenches by a CMP process.

12. A method for fabricating a magnetic field sensor having a multi-layer structure of alternating copper and magnetic metal film layers, the method comprising the steps of:

forming a copper barrier film made from one of Ta, TaN, TiN, and WN on a lower layer;

forming a magnetic metal film on the copper barrier film, wherein the magnetic metal film is made from one of Co, Ni, NiCo, and Fe;

forming a plurality of trenches in the magnetic metal film film; and filling the trenches with copper to form the plurality of alternating copper and magnetic metal film layers.

* * * * *